United States Patent
Morikawa

(10) Patent No.: US 6,545,617 B1
(45) Date of Patent: Apr. 8, 2003

(54) ASYNCHRONOUS SERIAL DATA RECEIVING DEVICE AND ASYNCHRONOUS SERIAL DATA TRANSMITTING DEVICE

(75) Inventor: Shun Morikawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/420,417

(22) Filed: Oct. 19, 1999

(30) Foreign Application Priority Data

Jun. 7, 1999 (JP) .......................................... 11-160138

(51) Int. Cl.$^7$ ................................................ H03M 9/00
(52) U.S. Cl. ....................................................... 341/100
(58) Field of Search .................................. 341/100, 101

(56) References Cited

U.S. PATENT DOCUMENTS 5,155,486 A * 10/1992 Murfet ........................ 341/100
6,140,946 A * 10/2000 Desrosiers ................... 341/100

FOREIGN PATENT DOCUMENTS

JP    59-72845    4/1984
JP    9-261215    10/1997

* cited by examiner

Primary Examiner—Brian Young
(74) Attorney, Agent, or Firm—Burns, Doane, Swecker & Mathis, LLP

(57) ABSTRACT

In the asynchronous serial data transmission and/or reception conducted by an asynchronous serial data communication device, an asynchronous serial data receiving device as an asynchronous serial data receiver section inputs a count correction signal (15) from a count correction circuit (2), and a control signal generating circuit (1) that generates a data shift signal (120) controls the timing for outputting the data shift signal (120) in accordance with the count value correction signal (15). The time intervals during which a serial-to-parallel conversion circuit (3) samples a communication data (4) is changed as to each data bit in accordance with this data shift signal, so that the sampling interval can be set more precisely than just a multiple of integer of the operation clock (110), thereby to improve the baud.

6 Claims, 15 Drawing Sheets

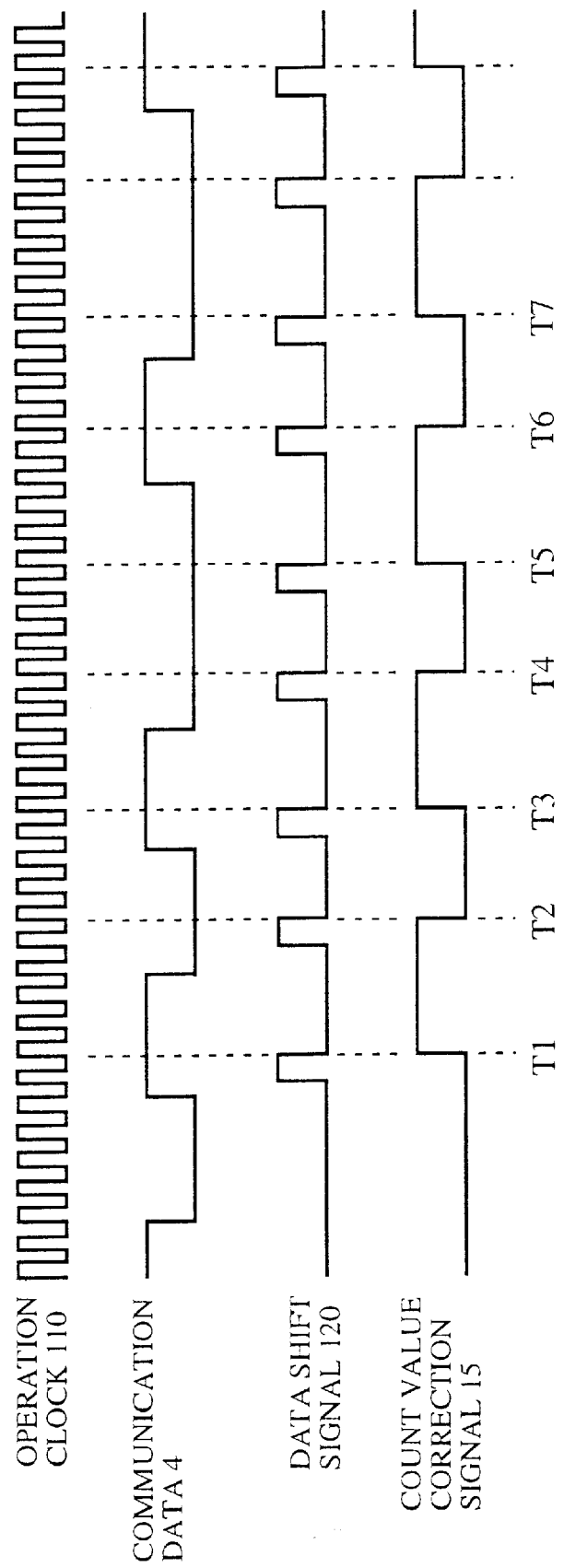

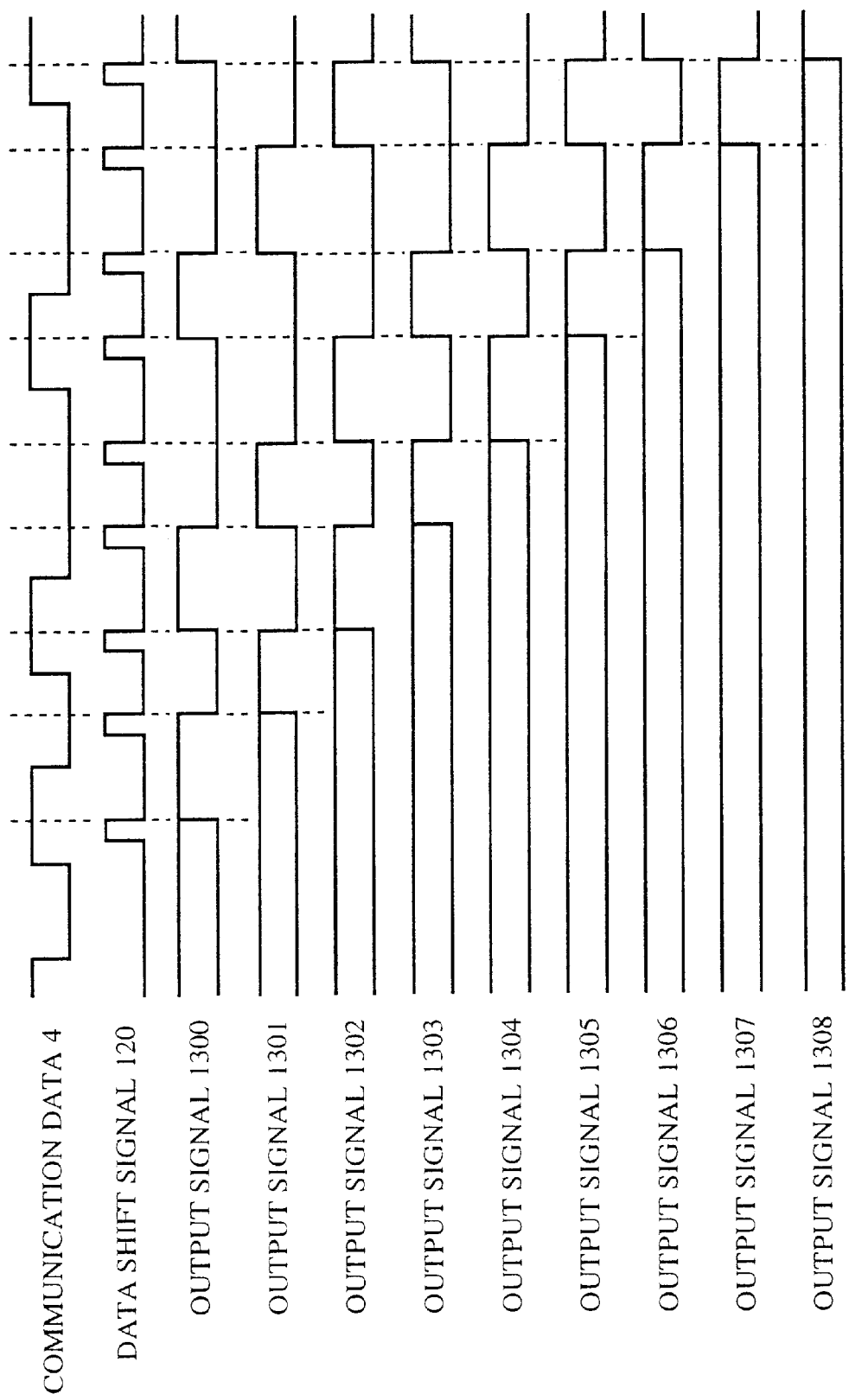

FIG.8
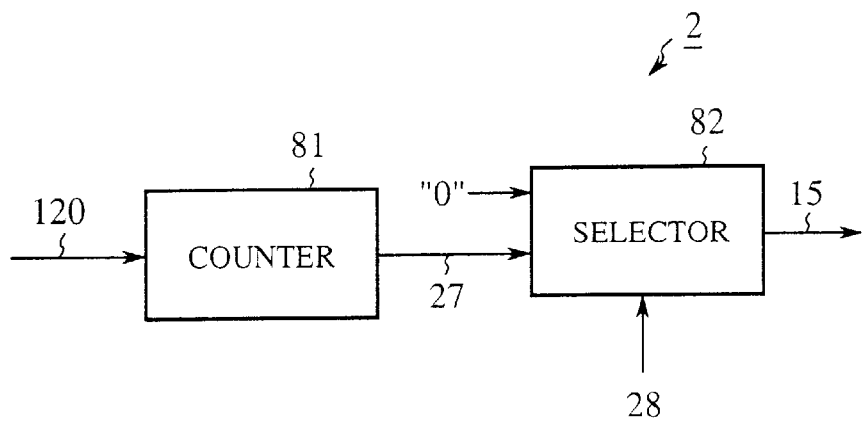
FIG.9
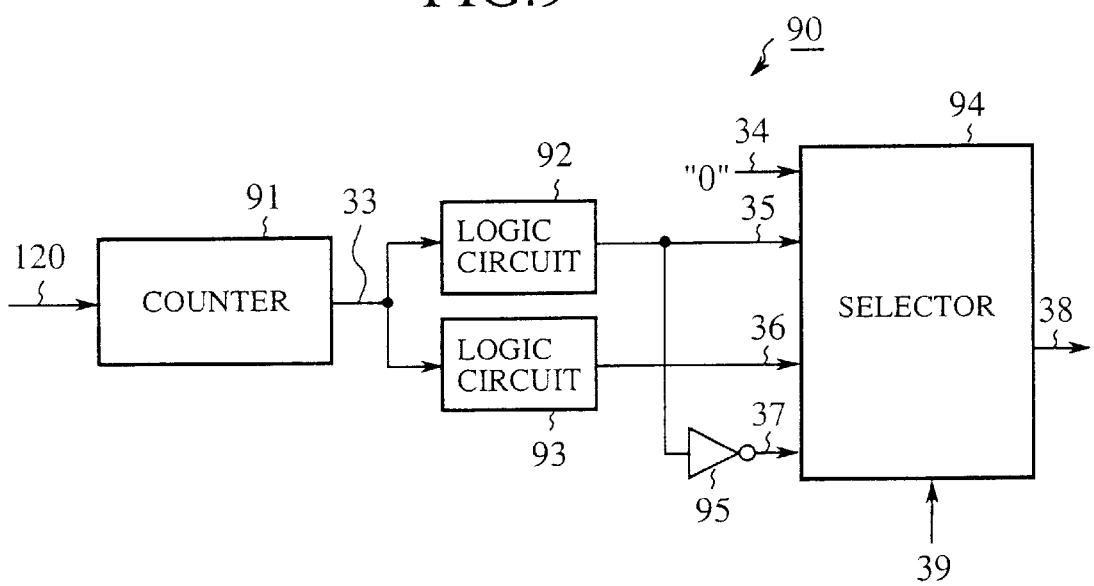
FIG.10
| INPUT 33 | OUTPUT 35 |
|---|---|
| 0 | 0 |
| 1 | 0 |
| 2 | 1 |
| 3 | 0 |
FIG.11
| INPUT 33 | OUTPUT 36 |
|---|---|
| 0 | 0 |
| 1 | 1 |
| 2 | 0 |
| 3 | 1 |

FIG.18
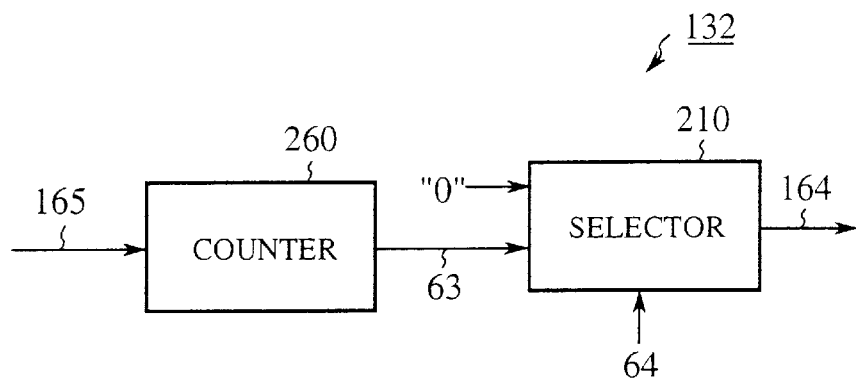
FIG.19
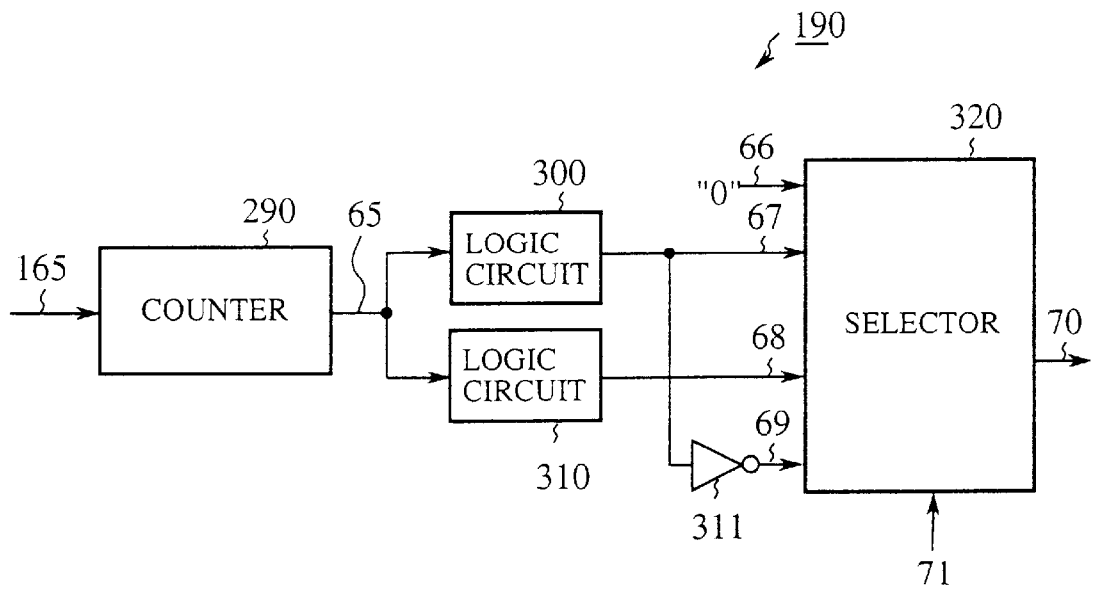
FIG.20
| INPUT 65 | OUTPUT 67 |
|---|---|
| 0 | 0 |
| 1 | 0 |
| 2 | 1 |
| 3 | 0 |
FIG.21
| INPUT 65 | OUTPUT 68 |
|---|---|
| 0 | 0 |
| 1 | 1 |
| 2 | 0 |
| 3 | 1 |

ASYNCHRONOUS SERIAL DATA RECEIVING DEVICE AND ASYNCHRONOUS SERIAL DATA TRANSMITTING DEVICE

BACKGROUND OF THE INVENTION

1. Field of the Invention

The present invention relates to an asynchronous serial data receiving device and an asynchronous serial data transmitting device, which are connected to or installed in a data processing device such as a microcomputer or the like, and more particularly relates to an asynchronous serial data receiving device and an asynchronous serial data transmitting device, which operate data communication based on the asynchronous data receiving and transmitting method capable of controlling the data reception conducted at the receiving device in the case where sampling interval between each of the bits forming a communication data is not constant, and also controlling the data transmission conducted at the transmitting device in the case where transmission interval between each of the data forming bits is not constant.

2. Description of the Related Art

Methods of communication between different microcomputers or between a microcomputer and a peripheral device are classified into two methods; namely a method in which data are received and/or transmitted in parallel per each data unit formed by a plurality of bits, and a method in which data are received and/or transmitted in serial per each data bit. The method in which data are received and/or transmitted in parallel can communicate more data per unit time than the case in which data are received and/or transmitted in serial. However, the former method requires many more cable distributions, which thereby increases the total cost for communications overall.

On the other hand, the methods in which data are received and/or transmitted in serial can be further classified into two communication methods; namely the synchronous serial data transmission and/or reception method in which the timing for synchronization between the transmission side and the reception side is adjusted by use of a clock signal, and the asynchronous serial data transmission and/or reception method in which no clock signal is used for adjusting the timing for synchronization. Since the asynchronous serial data transmission and/or reception method requires no clock signal, although it requires less cable distributions than those of the synchronous serial data transmission and/or reception method, its operation speed tends to be slow.

FIG. 23 is an exemplary view showing the general idea of a receiver section and a transmitter section in the asynchronous serial data communication system. In the figure, reference numeral 220 denotes an asynchronous serial data transmitting device as the transmitter section in the asynchronous serial data communications, numeral 221 denotes an asynchronous serial data receiving device as the receiver section in the asynchronous serial data communications, numeral 223 denotes a communication enable signal which is output from the receiver section 221, and input to the transmitter section 220, and reference numeral 224 denotes a communication data which is output from the transmitter section 220, and input to the receiver section 221.

The operation in the conventional asynchronous serial data communication system is now explained below.

FIG. 24 is an exemplary view showing an example of the communication data format used in the asynchronous serial data communications. In the figure, reference numeral 5 denotes a start bit which is a one-bit signal of the logic low level, 6 denotes a data bit, 7 denotes a parity bit which is added to the communication data in order to improve reliability of the data, and reference numeral 8 denotes a stop bit for indicating the end of the data transmission, which is formed by either one-bit signal or two-bit signal of the logic high level.

"Parity" includes an even parity which sets the parity bit in such a manner that the number of bits of the logic "1" (hereinafter may be referred to as "logic high level" or just as "high") in the communication data formed by the total number of data bits 6 and parity bit 7 becomes a certain even number, and also includes an odd parity which sets the parity bit in such a manner that the number of bits of the logic "1" in the communication data formed by the total number of data bits 6 and parity bit 7 becomes a certain odd number. There is also communication data which requires no parity bit.

FIG. 25 is a block diagram of the conventional asynchronous serial data receiving device as the receiver section 221. In the figure, reference numeral 252 denotes a serial-to-parallel conversion circuit which inputs a communication data 224 on the basis of a data shift signal 254, and converts it from the serial data to the parallel data 253.

FIG. 26 is a timing chart indicating the operation of the serial-to-parallel circuit 252 shown in FIG. 25. When the receiver section 221 is in the state in which it can receive the data signal, it sends a communication enable signal 223 by setting it to the logic low level to the transmitter section 220. The transmitter section 220 recognizes that the communication enable signal is in the low level, and sends a binary data signal "0101001001".

On this occasion, the start bit 5 has been added to the head portion of the binary data signal to be transmitted, and also the stop bit 8 has been added to the last portion of the data. The receiver section 221 receives the communication data 224, detects the start bit 5 and starts receiving the entire communication data 224.

The same baud rate is set to both the transmitter section 220 and the receiver section 221, wherein the reception and transmission of the communication data are executed in accordance with the thus set baud rate.

Under the ideal condition, the value of the communication data 224 is taken into the serial-to-parallel conversion circuit 252 at the center of each bit. In FIG. 26, the communication data 224 is taken into the serial-to-parallel conversion circuit 252, when the data shift signal 254 is changed from high to low.

Since the conventional asynchronous serial data transmitting and receiving devices are configured as such, the transmitter section 220 and the receiver section 221 generally operate at different operation clocks from each other. For this reason, since the time required for communicating a data of one bit can be set only to a time period whose length is a multiple of integer of an operation clock cycle, even in a case where the same baud rate is set to both the transmitter section 220 and the receiver section 221, there has been caused a setting error of the baud rate.

FIG. 26 shows an example of the operation in the case where the receiver section 221 receives a communication data formed by eight data bits 6 and one data bit 8, when the communication time for one-bit data is set to the time period corresponding to four cycles of the clock signal 11 used therein.

In the figure, it is arranged in such a manner that when the data shift signal 254 is changed from the high level to the low level, the communication data 224 is taken into the serial-to-parallel conversion circuit 252, and the data taken into the serial-to-parallel conversion circuit 252 is formed as "101000100" excluding the start bit 5.

In the example shown in FIG. 26, a communication data receiving error can be observed at the sixth, seventh and ninth bits of the communication data 224. If the baud rate set in the case of FIG. 26 is made smaller, the communication time for one-bit data is made longer, so that occurrence of the baud rate setting error with respect to the communication time for one-bit data can be efficiently suppressed.

For this reason above, in the actual case of the asynchronous serial data transmitting and receiving devices, there has been such a problem that the largest baud rate has to be suppressed down to the level in which no data receiving error occurs.

SUMMARY OF THE INVENTION

The present invention has bee n proposed to solve the problems aforementioned, and it is an object of the present invention to provide an asynchronous serial data receiving device and an asynchronous serial data transmitting device, which operate data communication based on the asynchronous data receiving and transmitting method capable of raising the maximum baud rate, yet even without changing the frequency of the operation clocks at the respective receiver section and the transmitter section, by enabling the setting of baud rate of the asynchronous serial data receiving device as the receiver section and that of the asynchronous serial data transmitting device as the transmitter section more precisely.

In order to achieve the above object, an asynchronous serial data receiving device according to the first aspect of the present invention comprises: a serial-to-parallel data conversion means, which takes in a communication data of one transmission unit starting with a start bit, and converts and outputs the communication data into a parallel data, a control signal generating means for generating a data shift signal to indicate the timing at which the serial-to-parallel conversion means should take in each of the bit data forming the communication data, and outputting the generated data shift signal to the serial-to-parallel conversion means, a count correction means, which generates a count value correction signal for controlling the time interval between a first timing at which it takes the first bit data of the received communication data into the serial-to-parallel conversion means and the second timing at which it takes in the second bit data following the first bit data into the serial-to-parallel conversion means for each of the bit data of the communication data, and outputs the generated count value correction signal to the control signal generating means, wherein the control signal generating means controls the output timing of the data shift signal in accordance with the count value correction signal output from the count correction means, and the serial-to-parallel conversion means takes in each of the bit data of the communication data on the basis of the data shift signal.

The count correction means in the asynchronous serial data receiving device as constructed above comprises: a counting means for sequentially inputting the data shift signals and counting the number of the data shift signals, and a selecting means for selecting either one of the signal output from the counting means and a predetermined value, and outputting the selected value to the control signal generating means as a count value correction signal.

An asynchronous serial data transmitting device according to the second aspect of the present invention comprises: a parallel-to-serial data conversion means, which transmits a communication data of one transmission unit starting with a start bit, and converts and outputs the communication data into a serial data, a control signal generating means for generating a data shift signal to indicate the timing at which the parallel-to-serial conversion means should transmit each of the bit data forming the communication data, and outputting the generated data shift signal to the parallel-to-serial conversion means, a count correction means, which generates a count value correction signal for controlling the time interval between a first timing at which it transmits the first bit data of the received communication data from the parallel-to-serial conversion means and the second timing at which it transmits the second bit data following the first bit data from the parallel-to-serial conversion means for each bit data of the communication data, and outputs the generated count value correction signal to the control signal generating means, wherein the control signal generating means controls the output timing of the data shift signal in accordance with the count value correction signal output from the count correction means, and the parallel-to-serial conversion means transmits each of the bit data of the communication data on the basis of the data shift signal.

The count correction means in the asynchronous serial data receiving device as constructed above comprises: a counting means for sequentially inputting the data shift signals and counting the number of the data shift signals, and a selecting means for selecting either one of the signal output from the counting means and a predetermined value, and outputting the selected value to the control signal generating means as a count value correction signal.

BRIEF DESCRIPTION OF THE DRAWINGS

FIG. 2 is a timing chart showing the operation of the asynchronous serial data receiving device shown in FIG. 1.

FIG. 4 is a timing chart showing the operation of the serial-to-parallel conversion circuit.

FIG. 8 is a block diagram showing an arrangement of the count value correction circuit in the asynchronous serial data receiving device shown in FIG. 1.

FIG. 9 is a block diagram showing an arrangement of the count value correction circuit in the asynchronous serial data receiving device according to a second embodiment of the present invention.

FIG. 10 is an exemplary view showing a truth table of the logic circuit.

FIG. 11 is an exemplary view showing a truth table of the logic circuit.

FIG. 18 is a block diagram showing an arrangement of the count value correction circuit in the asynchronous transmitting device shown in FIG. 13.

FIG. 19 is a block diagram showing an arrangement of the count value correction circuit in the asynchronous serial data transmitting device according to a fourth embodiment of the present invention.

FIG. 20 is an exemplary view showing a truth table of the logic circuit.

FIG. 21 is an exemplary view showing a truth table of the logic circuit.

DETAILED DESCRIPTION OF THE PREFERRED EMBODIMENTS

Several embodiments of the present invention are now explained hereinafter.

First Embodiment

The configuration and operation of an asynchronous serial data receiving device according to the present invention based on the asynchronous serial data receiving method will be explained with reference to FIGS. 1 to 8.

Figure 1:
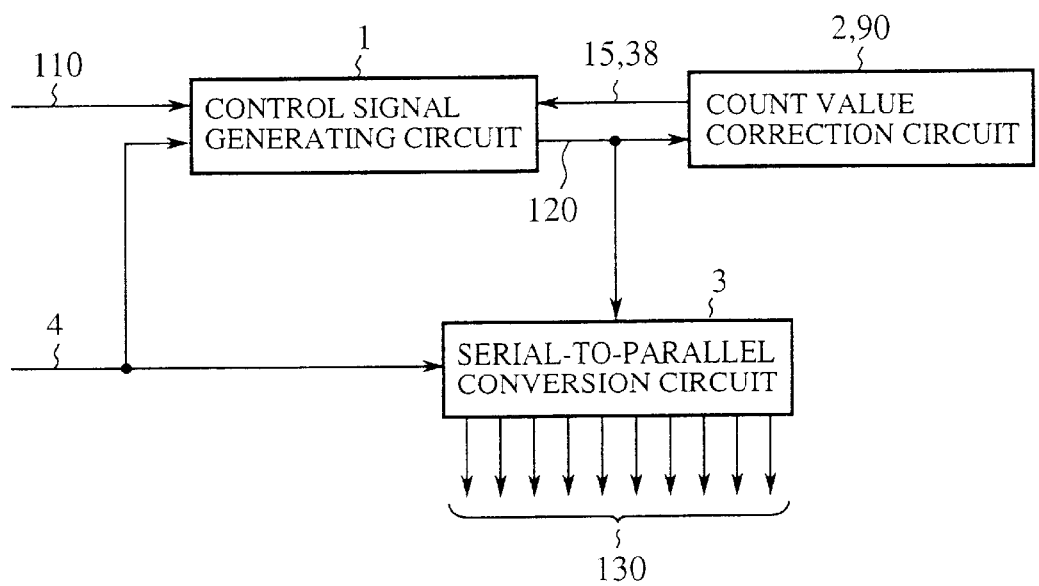
FIG. 1 is a schematic diagram showing an asynchronous serial data receiving device according to a first embodiment of the present invention.
Figure 13:
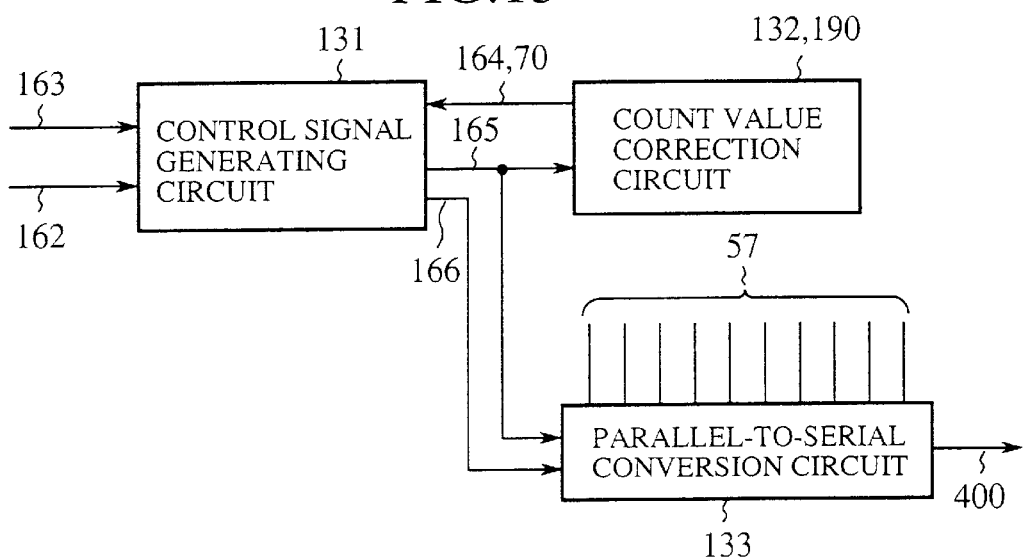
FIG. 13 is a block diagram showing an asynchronous serial data receiving device according to a third embodiment of the present invention.

FIG. 1 is a schematic diagram showing an asynchronous serial data receiving device according to the first embodiment of the present invention. In the figure, reference numeral 1 denotes a control signal generating circuit which inputs an operation clock 110 of the receiver section and a communication data 4, and generates and outputs a data shift signal 120. Note that the general schematic view of the asynchronous serial data receiving device and the asynchronous serial data transmitting device of the present invention is shown in FIG. 13.

Further in the figure, reference numeral 2 denotes a count value correction circuit which inputs the data shift signal 120, and generates and outputs a count value correction signal 15, numeral 3 denotes a serial-to-parallel circuit which inputs the data shift signal 120 and takes in the communication data, and converts the communication data of a serial format to the communication data of a parallel format 130.

In the asynchronous serial data receiving device according to the first embodiment, the communication time for one-bit data is set not only to a multiple of integer of the operation clock 110, but also set per 0.5-cycle unit such as 3.5 cycles, 4.0 cycles, 4.5 cycles and so on.

The operation of the asynchronous serial data receiving device according to the present embodiment is now explained as follows.

FIG. 2 is a timing chart showing the operation of the asynchronous serial data receiving device based on the asynchronous serial data receiving method shown in FIG. 1.

Figure 24:
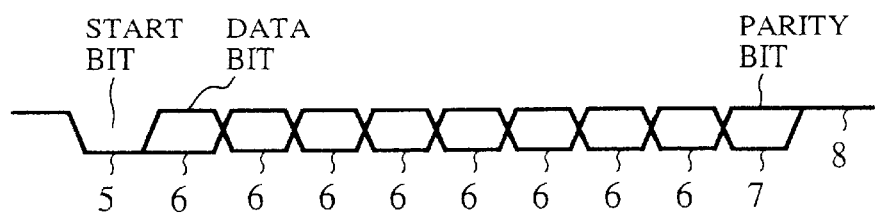
FIG. 24 is an exemplary view showing a format of the communication data used in the asynchronous serial data communications.
Figure 25:
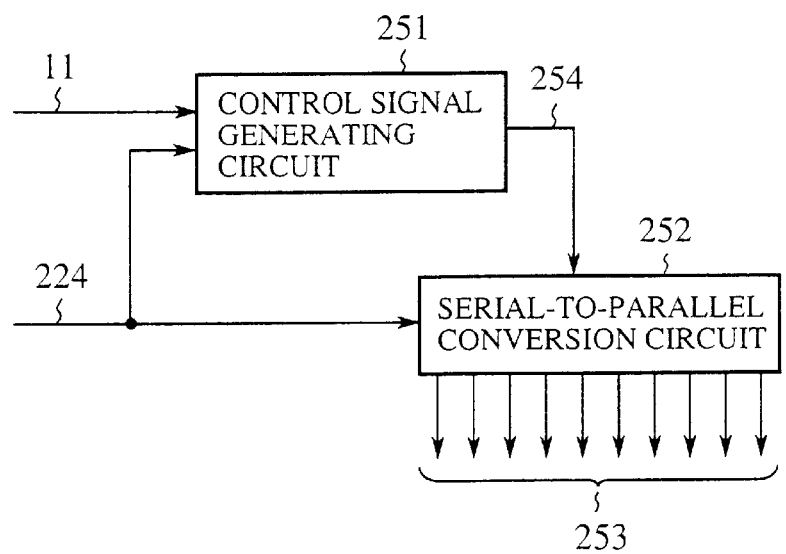
FIG. 25 is a block diagram showing the conventional asynchronous serial data receiving device in the asynchronous serial data communications.
Figure 26:
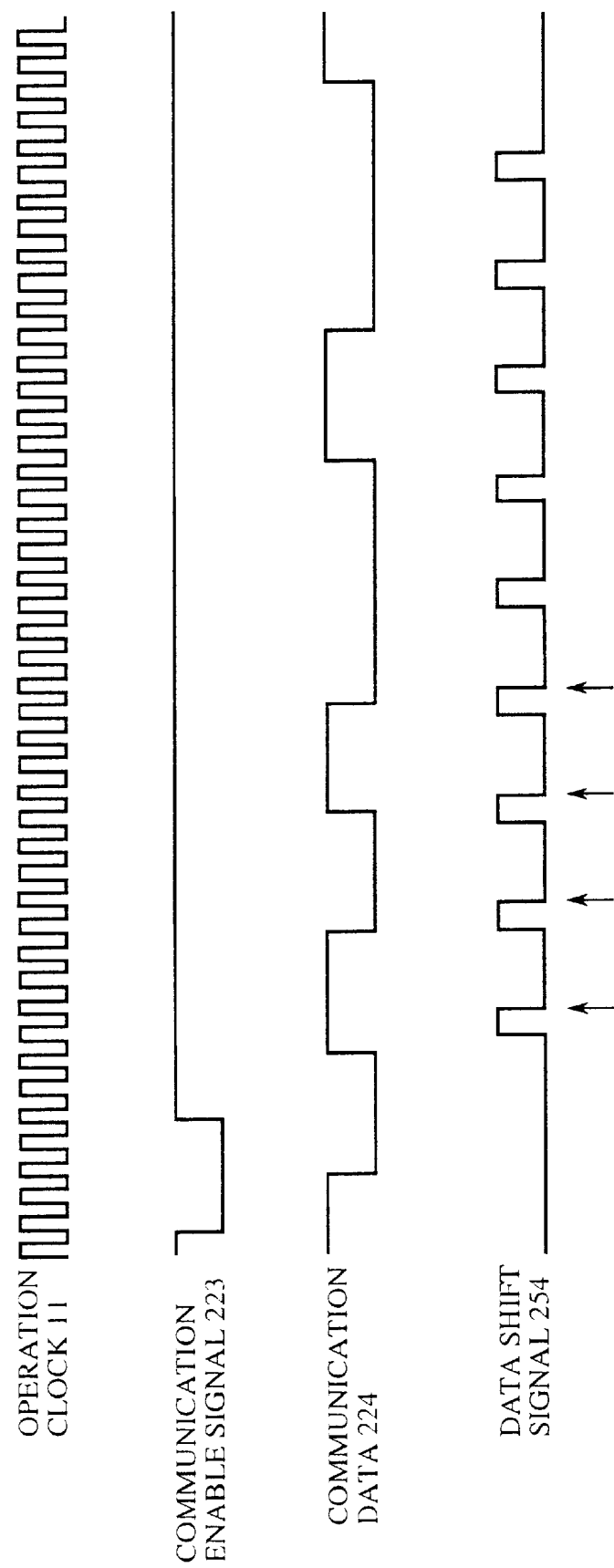
FIG. 26 is a timing chart showing the operation of the serial-to-parallel conversion circuit in the receiver section shown in FIG. 25.

In the asynchronous serial data receiving device provided with the configuration of FIG. 1, the signal receiving operation thereof is explained in the case where the communication time for one-bit data is set to 4.5 cycles of the operation clock 110, with reference to the timing chart shown in FIG. 2. It should be noted that the number of cycles in the following explanation indicates the number of cycles of the operation clock 110. Further, the data arrangement of the communication data 4 is same as that shown in FIG. 24.

When the control signal generating circuit 1 receives the communication data 4, and detects a start bit 5 from the communication data 4, it starts to control the data shift signal 120. At the timing where the data shift signal 120 falls from high to low, the first bit of all the data bits forming the communication data 4 is taken into the serial-to-parallel conversion circuit 3, and thereafter, the similar operation is repeated until the stop bit 8 is taken in.

When the stop bit 8 is taken into the serial-to-parallel conversion circuit 3, the data shift signal 120 is maintained at the low level by the control signal generating circuit 1 until the start bit 5 of the next communication data is detected. At this time, as to all the bits up to the stop bit 8 excluding the start bit 5, which are to be taken in after the start bit 5 is captured, the time interval from the timing at which the serial-to-parallel conversion circuit 3 captures the preceding bit until the timing at which it captures in the next bit, namely, the time interval from the falling edge of the data shift signal 120 to the next falling edge thereof is formed by 5 cycles (between the timings T1 and T2) and 4 cycles (between the timings T2 and T3) appearing alternately. By this operation, the time interval for taking the communication data 4 into the serial-to-parallel conversion circuit 3 is made 4.5 cycles on the average.

Figure 3:
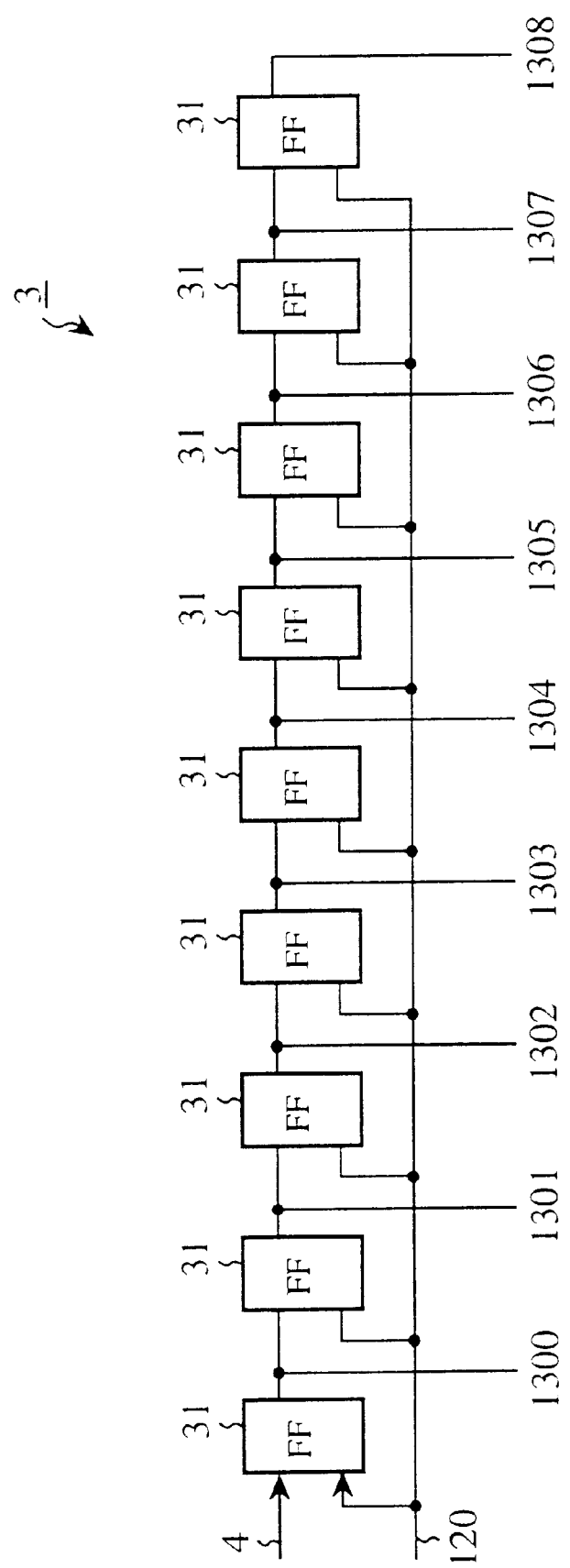
FIG. 3 is a block diagram showing an arrangement of the serial-to-parallel conversion circuit in the asynchronous serial data receiving device shown in FIG. 1.

FIG. 3 is a block diagram showing an arrangement of the serial-to-parallel conversion circuit 3 in the asynchronous serial data receiving device shown in FIG. 1. In the figure, reference numeral 31 denotes a flip-flop (FF) which is a storage element, and stores the communication data 4 therein when the data shift signal 120 provided by the control signal generating circuit 1 falls. In the same way, each of the flip-flops 31 stores the respective output data 1300 to 1307 from the flip-flop 31 residing the left side thereof, in synchronization with the timing at which the level of the data shift 120 falls.

In this way, each of the output data 1300 to 1308 of the flip-flops 31 forming the serial-to-parallel conversion circuit 3 corresponds to the data representing each one bit of the communication data 130 in the serial-to-parallel conversion circuit 3 shown in FIG. 1. Each of the structural elements of the serial-to-parallel conversion circuit 3 is a shift register.

FIG. 4 is a timing chart showing the operation of the serial-to-parallel conversion circuit.

The bit data of the communication data 4 is taken into the flip-flop 31 of the first stage at the timing when the data shift signal 120 provided by the control signal generating circuit 1 falls, and the output value 1300 from this flip-flop 31 is updated. At the same time, the output value 1300 of the first-stage flip-flop 31 at the timing before the data shift signal 120 falls is taken into the flip-flop 31 of the second stage, and the output value 1301 of the flip-flop 31 of the second stage is updated. The operation of each of the flip-clop 31 of other following stages is also performed simultaneously.

In this way, each time the data shift signal 120 falls, a new bit value of the communication data is taken into the first-stage flip-flop 31, and thereafter each of the output values 1300 to 1307 is shifted to the right stage thereof, so that these output values are captured by the flip-flop 31 of the following stages.

Figure 5:
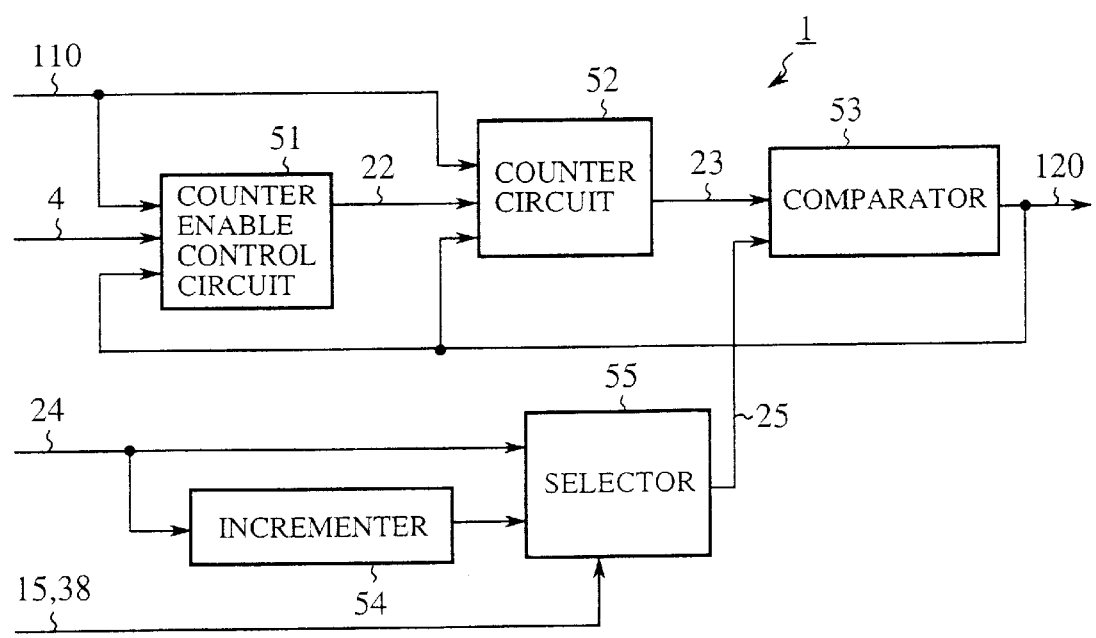
FIG. 5 is a block diagram showing an arrangement of the control signal generating circuit in the asynchronous serial data receiving device shown in FIG. 1.

FIG. 5 is a block diagram showing an arrangement of the control signal generating circuit in the asynchronous serial data receiving device shown in FIG. 1. In the figure, reference numeral 51 denotes a counter enable control circuit, which inputs the operation clock signal 110 and the communication data 4, and generates and outputs a counter enable signal 22.

In the same figure, numeral 52 denotes a counter circuit, which inputs the operation clock 110 and the counter enable signal 22, together with the data shift signal 120, and the operation of the counter circuit 52 stops when the counter enable signal 22 is set to the low level. Further, the counter value is cleared in the next cycle by setting the level of the data shift signal 120 to high.

Reference numeral 53 denotes a comparator that compares two signals; namely an input signal 23 (count value) and a selector output signal 25, and if the levels of these signals are equal to each other, then it puts a high-level signal, whereas it outputs a low-level signal otherwise.

Numeral 54 denotes an incrementer for outputting the value which is obtained by adding 1 to a communication time setting signal 24, numeral 55 denotes a selector which inputs a communication time setting signal 24 and an output signal from the incrementer 54, and selects either one of these signals in accordance with a count value correction signal 15. The communication time setting signal is denoted by reference numeral 24, but only the integer portion of the number of operation cycle which corresponds to the communication time for one bit is input to the selector 55. For example, when the communication time for one bit of the communication data is set to the time period corresponding to 6.5 cycles of the operation clock, "6" is designated as the communication time setting signal 24. Note that this communication time setting signal 24 is an output signal from a storage means (not shown), which can be set or modified by the CPU or the like (not shown).

Figure 6:
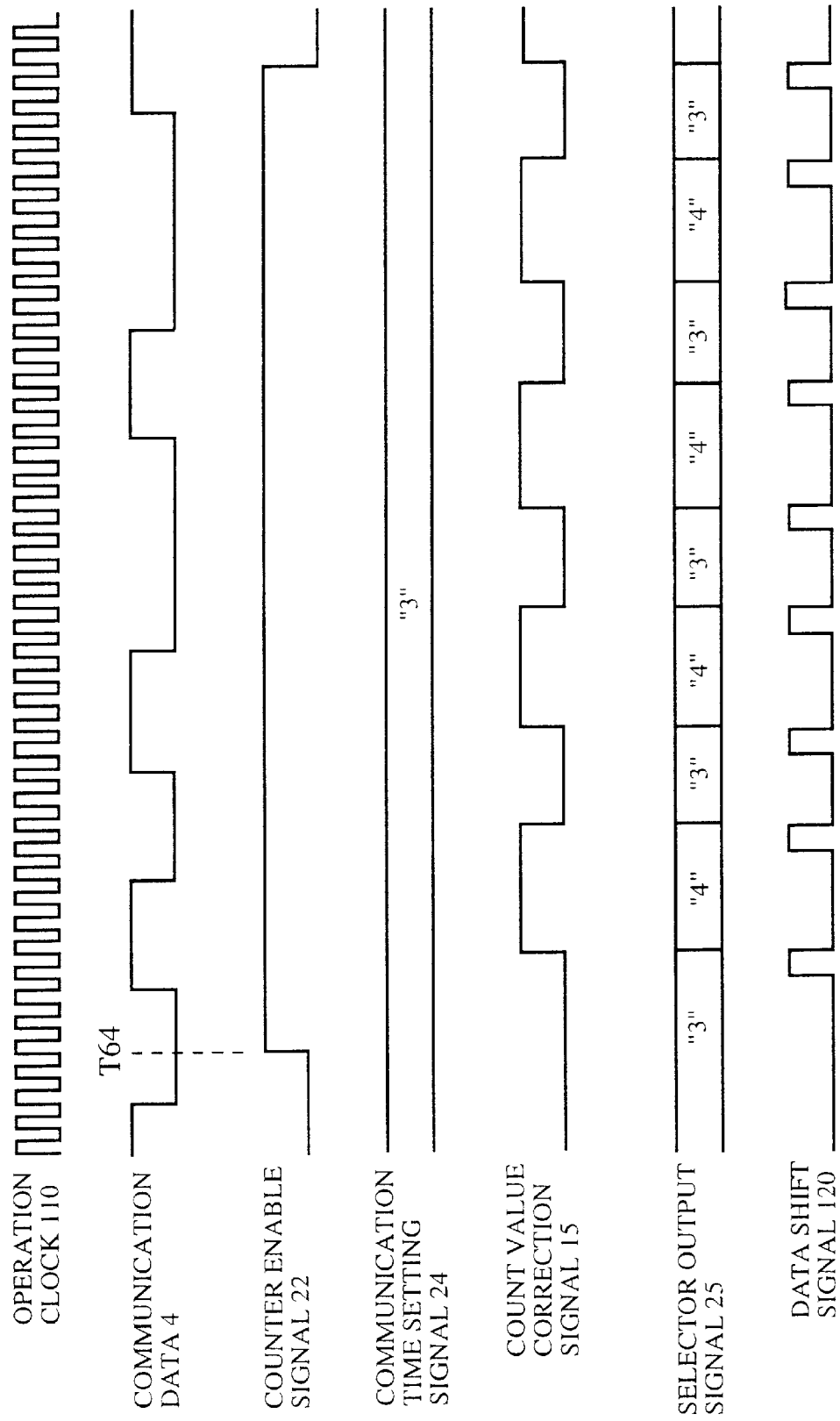
FIG. 6 is a timing chart showing the operation of the control signal generating circuit.
Figure 7:
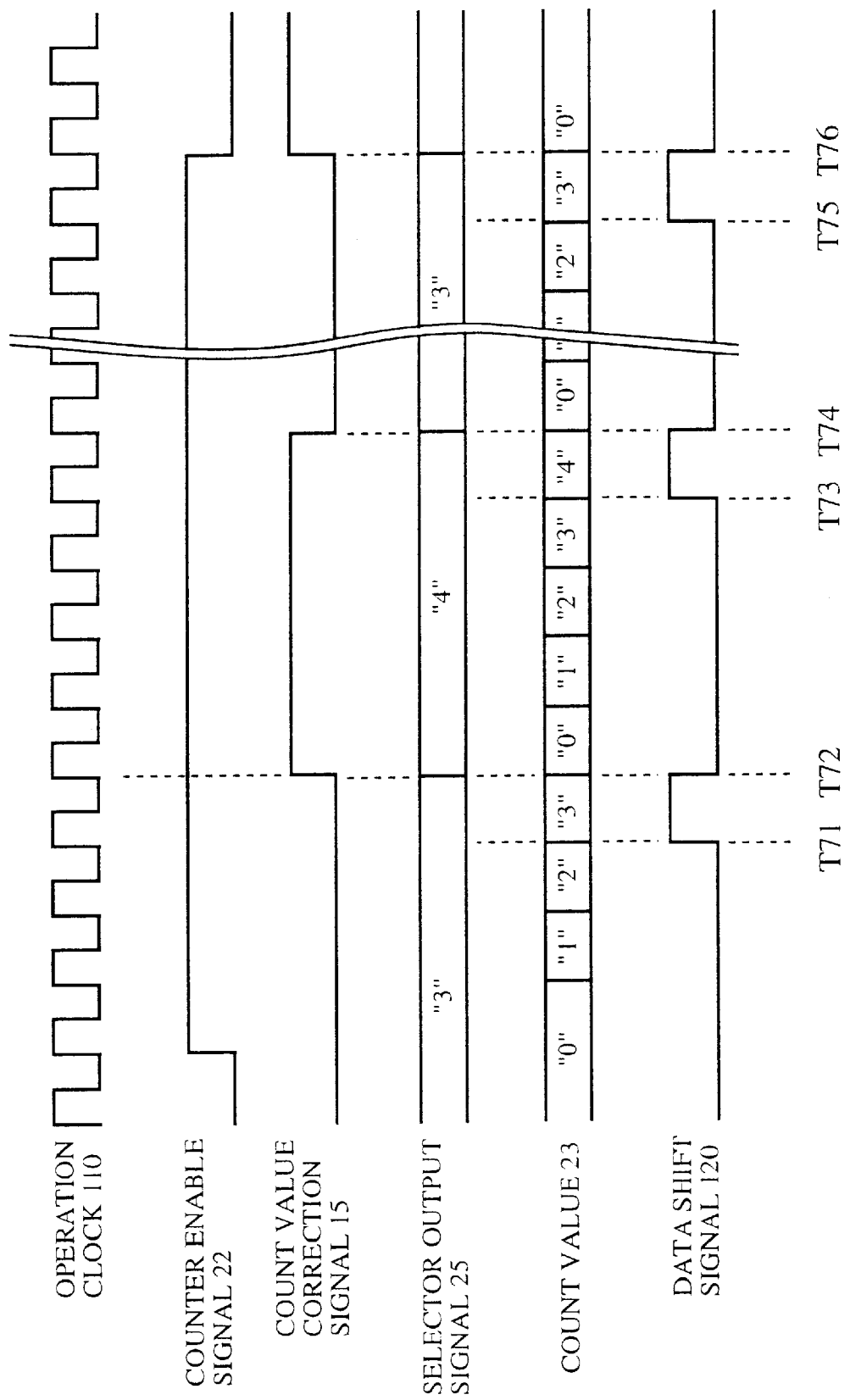
FIG. 7 is a timing chart showing the operation of the counter n the control signal generating circuit.

FIGS. 6 and 7 are timing charts showing the operation of the control signal generating circuit 1 shown in FIG. 5. FIG. 6 is a timing chart showing the operation of the control signal generating circuit 1 in the case where the communication data is formed by eight bits, and the stop bit is formed by only one bit, and specifically, it shows the case in which the communication time for one bit configuring the communication data 4 is set to the time corresponding to 4.5 cycles of the operation clock 110. On the other hand, FIG. 7 is a timing chart showing the operation of the counter circuit 52 which is a structural element of the control signal generating circuit 1 shown in FIG. 6.

As shown in FIG. 6, when the counter enable control circuit 51 detects the start bit of the communication data 4, it sets the counter enable signal 22 to high at the center point of the start bit, which corresponds to the timing T64, at which a half the communication time for one bit has elapsed after the fall of the communication data 4. When the counter enable signal 22 becomes high, the operation of the counter circuit 52 starts.

As shown in FIG. 7, when the count value 23 and the value of the selector output signal 25 become equal to each other, the data shift signal 120 becomes high (at timings T71, T73 and T75). The value of the count value correction signal 15 varies at each falling edge of the data shift signal 120, and the value of the selector output signal 25 is switched by the selector 55 (at timings T72, T74 and T76). Due to this, sampling interval of the communication data 4 is variably changed (the time interval between T72 and T74, and that between T74 and T76).

When the data shift signal 120 becomes high 9 times, the counter enable control circuit 51 sets the counter enable signal 22 to the low level, and stops its data receiving operation.

FIG. 8 is a block diagram showing an arrangement of the count value correction circuit 2. In the figure, reference numeral 81 denotes a one-bit counter, and the level of output value 27 from the counter 81 (hereinafter referred to just as "counter output value 27") is inverted each time the data shift signal 120 falls. Numeral 82 denotes a selector, to which twice as many as the decimal portion of the number of cycles corresponding to data communication time for one bit is input as a selector selection signal 28. More specifically, when the communication time for one-bit data in the communication data is set to 6.5 cycles of the operation clock, "1" corresponding to the value twice as many as "0.5" is input. Equally, when the communication time of one-bit data in the communication data is set to 7.0 cycles of the operation clock, "0" corresponding to the value twice as many as "0.0" is input. Note that the selector selection signal 28 is an output signal from a storage element (not shown) which can be set and/or modified in the CPU or the like (not shown).

When the selector selection signal 28 input to the selector 82 is "0", the fixed value "0" is selected out of the counter output value 27 fed from the counter 81 and the fixed value "0", and the thus selected fixed value "0" is output to the control signal generating circuit 1 as a count value correction signal 15. When the ground potential (0V) is "0", this fixed value "0" can be obtained by setting it to the value "0".

When the selector selection signal 28 input to the selector 82 is "1", the counter output value 27 is selected out of the counter output value 27 fed from the counter 81 and the fixed value "0", and the thus selected counter output value 27 is output to the control signal generating circuit 1 as a count value correction signal 15. In other words, each time the data shift signal 120 falls, the count value correction signal 15 output to the control signal generating circuit 1 from the selector 82 is inverted.

As explained heretofore, according to this first embodiment, by adding a count value correction circuit 2 to the control signal generating circuit 1 and the serial-to-parallel conversion circuit 3, the sampling interval of the communication data 4 during the asynchronous data transmission and/or reception can be changed per each bit. For this reason, the sampling interval can be set more precisely than a multiple of integer of the operation clock 110, so that the baud rate can be more precisely set without raising the operation frequency of the asynchronous serial data receiving device as a receiver section, and thus setting error of the baud rate between the asynchronous serial data receiving device as a receiver section and the asynchronous serial data transmitting device as a transmitter section can be efficiently suppressed, and the maximum baud rate can thereby be improved.

Second Embodiment

FIG. 9 is a block diagram showing an arrangement of the count value correction circuit in the asynchronous serial data receiving device according to the second embodiment of the present invention. The count value correction circuit according to the second embodiment is an improved arrangement of the count value correction circuit shown in FIG. 8. In the figure, reference numeral 91 denotes a two-bit counter, numeral 94 denotes a selector of 4 inputs and 1 output, to which four times as many as the decimal portion of the number of cycles corresponding to the data communication time for one bit is input as a selector selection signal 39. When the selector selection signal is 0, 1, 2 and 3, input signals 34, 35, 36 and 37 are respectively selected and output as a count value correction signal 38. Numerals 92 and 93 are logic circuits 33 for inputting the output value of counter (hereinafter abbreviated to the "counter output value 33") output from the counter 91 so as to carry out logic operation. Numeral 95 denotes an inverter.

The operation of the asynchronous serial data receiving device according to the second embodiment of the present invention is now explained below.

The count value correction circuit 90 shown in FIG. 9 can set the communication time for one bit of the communication data 4 per 0.25-cycle unit such as 4.0 cycles, 4.25 cycles, 4.50 cycles and 4.75 cycles.

Figure 12:
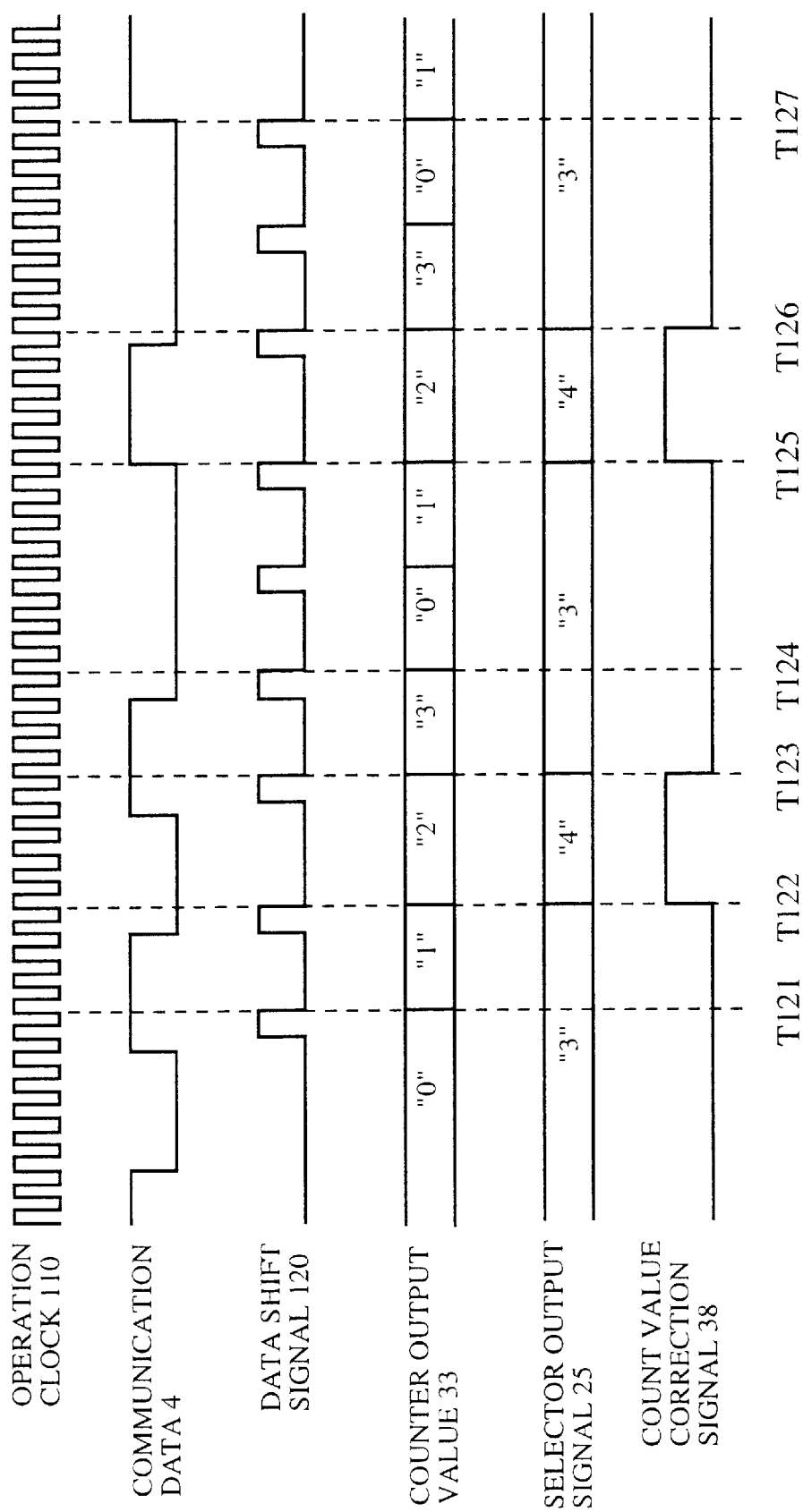
FIG. 12 is a timing chart showing the operation of the count value correction circuit shown in FIG. 9.

FIG. 10 is an exemplary view showing a truth table of the logic circuit 92, and FIG. 11 is an exemplary view showing a truth table of the logic circuit 93. FIG. 12 is a timing chart showing the operation of the count value correction circuit 90 of the present embodiment.

The following is an explanation about receiving operation of the asynchronous serial data receiving device in which the communication time for one bit is set to the time period corresponding to 4.25 cycles of the operation clock.

When the communication time for one bit is set to the time corresponding to 4.25 cycles, "1" corresponding to the value four times as many as the decimal portion 0.25 of the numeral 4.25 is input as a selector selection signal 39. Thus, an input signal 35 is selected in the selector 94, and is output as a count value correction signal 38. During the receiving operation, the counter output value 33 is incremented each time the data shift signal 120 falls. On the basis of the truth table shown in FIG. 10, each time the data for 4 bits is received, the input signal 35, namely the count value correction signal 38 is set to the high level for the period corresponding to one bit (time period between T122 and T123, and that between T125 and T126).

When the count value correction signal 38 is in the low level, the communication data 4 is taken in at 4-cycle intervals, and when the count value correction signal 38 is in the high level, the correction data 4 is taken in at 5-cycle intervals. Due to this, one bit of the communication data 4 is received at 4.25 cycles on an average.

The second embodiment has explained as to the case in which the communication time for one bit of the communication data 4 is set per 0.25-cycle unit in the count value correction circuit 90 as shown in FIGS. 9 and 12, such as 4.00 cycles, 4.25 cycles, 4.50 cycles and 4.75 cycles. However, the present invention is not limited to this, but a count value correction circuit capable of setting the baud rate more precisely such as per 0.125-cycle unit or the like can be implemented, according to the same method as that of FIGS. 9 and 12, but in combination with the logic circuits, selector selection signal and the selector.

As explained heretofore, according to the second embodiment, since the count value correction circuit 90 is formed by use of the counter 91, the logic circuits 92 and 93 and the selector 94, the communication time for one bit can be set per 0.25-cycle unit, or by a more precise baud rate. Accordingly, the time interval for sampling the communication data 4 can be changed for each bit, thereby to enable to set the sampling interval more precisely than a multiple of integer of the operation clock. Thus, the baud rate can be more precisely set without raising the operation frequency of the asynchronous serial data receiving device as a receiver section, and accordingly setting error of the baud rate between the asynchronous serial data receiving device as a receiver section and the asynchronous serial data transmitting device as a transmitter section can be efficiently reduced, and the maximum baud rate can be thereby improved.

Third Embodiment

The configuration and operation of an asynchronous serial data transmitting device according to the present invention based on the asynchronous serial data transmitting method will be explained with reference to FIGS. 13 to 18.

Figure 23:
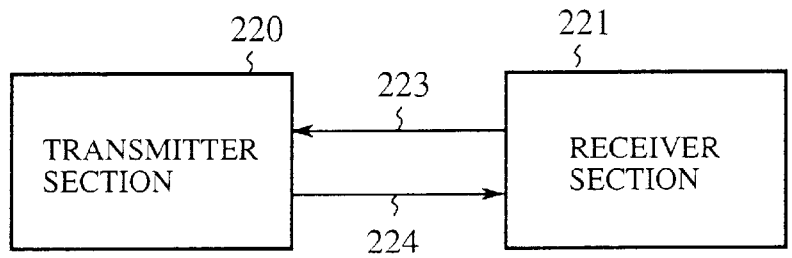
FIG. 23 is an exemplary view showing the general idea of the transmitter section and the receiver section in the asynchronous serial data communications.

FIG. 13 is a block diagram showing an asynchronous serial data transmitting device according to the third embodiment of the present invention. In the figure, reference numeral 131 denotes a control signal generating circuit which inputs the operation clock 163 of the transmitter section and the communication enable signal 162, and generates a data shift signal 165 and a data select signal 166. Note that the general construction including the asynchronous serial data transmitting device and the asynchronous serial data transmitting method according to the present invention is shown in FIG. 23.

In the asynchronous serial data transmitting device according to the third embodiment, the communication time for one bit of the communication enable signal 4 can be set not only to a multiple of integer of the operation clock 163, but also per 0.5-cycle unit such as 4.5 cycles, 5.0 cycles and 5.5 cycles. Reference numeral 132 is a count value correction circuit, which inputs the data shift signal 165 and outputs a count value correction signal 164. Numeral 133 denotes a parallel-to-serial conversion circuit, which converts the parallel data 57 to serial data, and outputs the converted data as a communication data 400.

The operation of the asynchronous serial data transmitting device according to the third embodiment of the present invention is now explained below.

Figure 14:
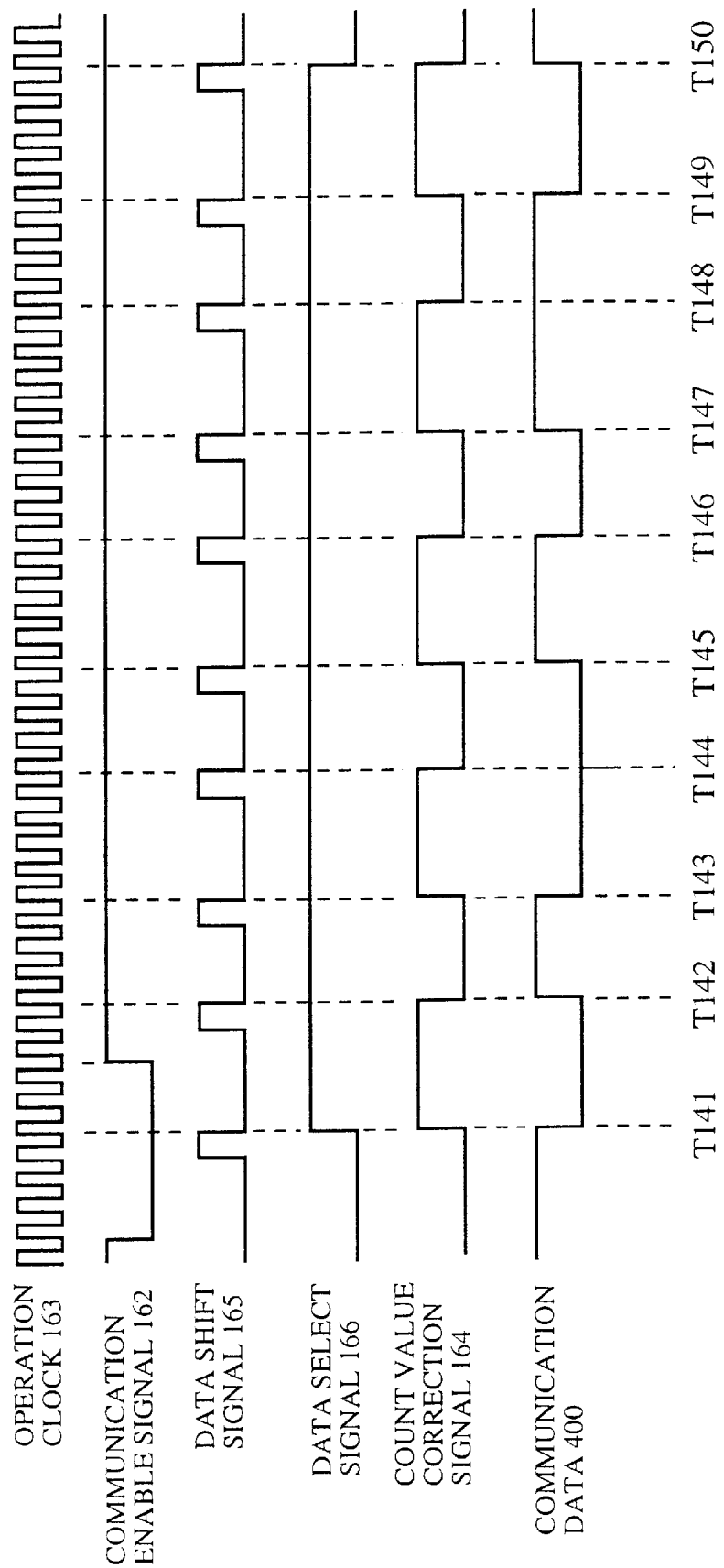
FIG. 14 is a timing chart showing the operation of the asynchronous serial data transmitting device shown in FIG. 13.

FIG. 14 is a timing chart showing the operation of the asynchronous serial data transmitting device according to the present invention shown in FIG. 13. The timing chart shown in FIG. 14 shows the case in which the time required for transmission (hereinafter referred to as "transmission time") for one bit is set to the time period corresponding to 4.5 cycles of the operation clock 163.

When the communication enable signal 162 becomes low, the control signal generating circuit 131 starts controlling the data shift signal 165. After the start of transmitting operation, at the timing where the data shift signal 165 falls from high to low (timing T141), the communication data 400 is set to the low level, and transmission of the start bit 5 is started. Thereafter, at the timing where the data shift signal 165 falls from high to low (timing T142), the first data bit is transmitted. Thereafter, the same operation is repeated until the stop bit 8 is transmitted. When the stop bit 8 is transmitted, the data shift signal 165 is maintained at the low level until the transmission of the next communication data 400 is started (at the timing T150).

During the time period since the parallel-to-serial conversion circuit 133 transmits the start bit 5 until it transmits the last stop bit 8, the time interval from the timing at which the parallel-to-serial conversion circuit 133 starts transmitting a certain bit until the timing at which it transmits the next bit, that is, the time interval from the rising edge of the data shift signal 165 to the next rising edge is formed by 5 cycles (between the timings T141 and T142) and 4 cycles (between the timings T142 and T143) alternately appearing. By this operation, the time interval for outputting a data of one bit from the parallel-to-serial conversion circuit 3 is 4.5 cycles on the average.

Figure 15:
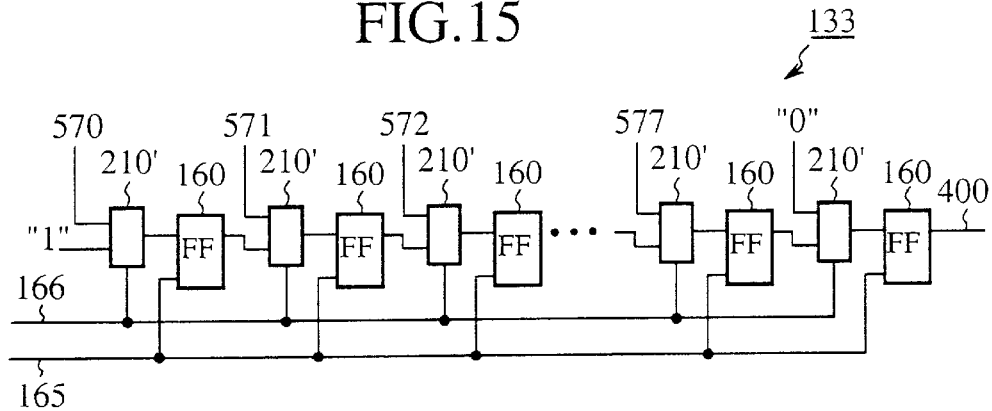
FIG. 15 is a block diagram showing an arrangement of the parallel-to-serial conversion circuit in the asynchronous serial data transmitting device shown in FIG. 13.

FIG. 15 is a block diagram showing an arrangement of the parallel-to-serial conversion circuit 133 in the asynchronous serial data transmitting device shown in FIG. 13, wherein each of 210' denotes a selector of 2 inputs and 1 output. When the data select signal 166 is in the low level, each of these selectors 210' selects the bit-side line (570 to 577) of the parallel data 57 shown in FIG. 13, whereas when the data select signal is in the high level, each selector selects an output value of the flip-flop residing at the left side. Specifically, the first-stage selector 210' selects the fixed value "1".

Reference numeral 160 denotes a flip-flop as a storage element, which takes in the output value of the selector 210 residing the left side.

Figure 16:
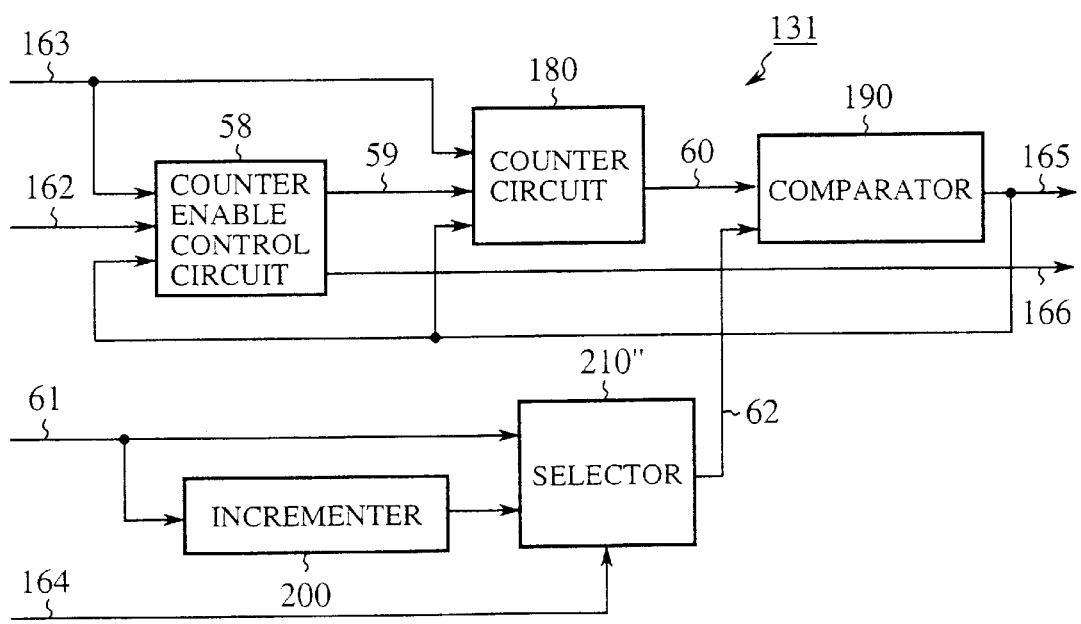
FIG. 16 is a block diagram of the control signal generating circuit in the asynchronous serial data transmitting device shown in FIG. 13.

FIG. 16 is a block diagram of the control signal generating circuit 131. In the figure, reference numeral 58 denotes a counter enable control circuit which inputs the communication enable signal 162 and the data shift signal 165, and generates a counter enable signal 59 and a data select signal 166, in synchronization with the operation clock of the asynchronous serial data transmitting device as a transmitter section.

Reference numeral 180 denotes a counter circuit which inputs the operation clock 163, and the counter enable signal 59, together with the data shift signal 165. The counting operation of the counter circuit 180 can be stopped by setting the counter enable signal 59 output from the counter enable control circuit 58 to the low level.

Further, the counter circuit 180 clears the value of the counter in the next cycle by setting the level of the data shift signal 165 output from a comparison circuit 190 to high. The comparator denoted by reference numeral 190 inputs an output signal 60 from the counter circuit 180 and a selector output signal 62, and compares these signals 60 and 62, wherein if they are equal to each other, the comparator 190 outputs a high-level signal, whereas it outputs a low-level of signal if they are different from each other. Reference numeral 200 denotes an incrementer for adding "1" to a communication time setting signal 61 and outputting the thus obtained value, and numeral 210" denotes a selector for selecting one of two input signals by use of the count value correction signal 164, and outputting the thus selected value.

The communication time setting signal denoted by reference numeral 61 inputs only the integer portion of the number of cycles corresponding to the communication time for one bit of the communication data 400. More specifically, when the communication time for one bit is set to the time corresponding to the operation cycle 6.5 cycles, the value of the communication time setting signal 61 becomes "6". This communication time setting signal 61 is an output signal from the storage element (not shown) whose value can be set or changed by the CPU or the like (not shown).

Figure 17:
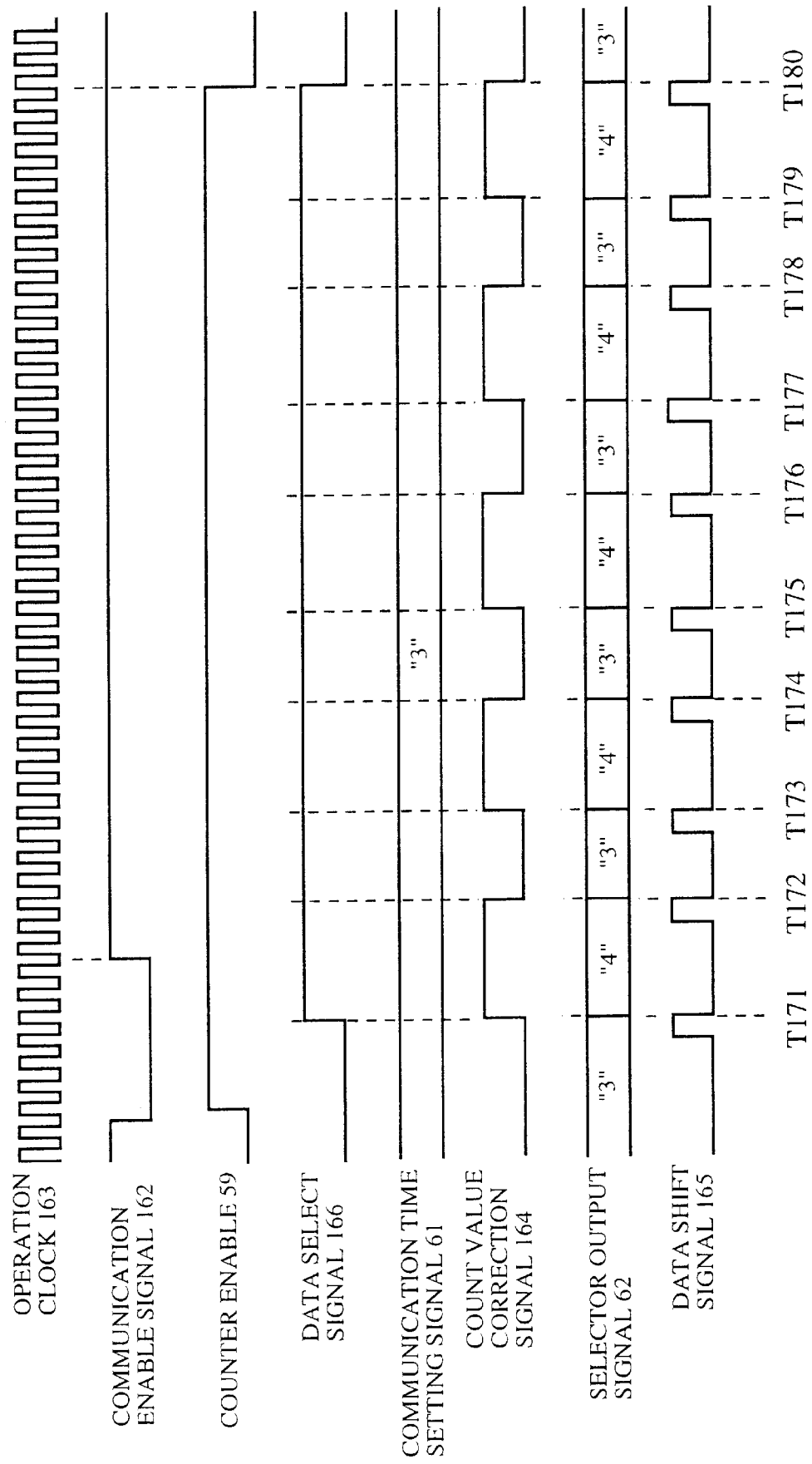
FIG. 17 is a timing chart showing the operation of the control signal generating circuit shown in FIG. 16.

FIG. 17 is a timing chart showing the operation of the control signal generating circuit 131 in the asynchronous serial data transmitting device according to the third embodiment.

The operation of the control signal generating circuit 131 is explained with reference to the timing chart of FIG. 17. The timing chart of FIG. 17 indicates the operation of the control signal generating circuit 131 in the case where the communication data 400 is formed by eight data bits and one stop bit, and the communication time for one data bit is set to 4.5 cycles of the operation clock 163.

When the counter enable control circuit 58 detects that the communication enable signal 162 is in the low level, it sets the counter enable signal 59 to high. When the counter enable signal 59 is set to high, the counter circuit 180 starts operating. When the signal 60 output from the counter circuit 180 and the value output from the selector 210" become the same value, the data shift signal 165 is set to the high level.

At the timing where the data shift signal 165 falls for the first time, immediately after the start of data transmission of a certain data, the data select signal 166 is in the low level. Therefore, the value of the parallel data 57 is taken into the parallel-to-serial conversion circuit 133 shown in FIG. 15, and the communication data 400 is set to the low level. That is, the transmission of the start bit 5 of the communication data 4 is started.

On this occasion, the counter enable control circuit 58 changes the logic level of the data select signal 166 from high to low. Thereafter, each time the data shift signal 165 falls, namely at the timings T172, T173, T174, T175, T176, T176, T177, T178 and T179, the value of the count value correction signal 164 varies and the value of the selector output signal 62 from the selector 210" is changed.

By this operation, the time interval from the timing where the data shift signal 165 falls to the timing of the next fall, that is, the transmission time for one bit is changed. More specifically, in the timing chart of FIG. 17, the respective time intervals between T171 and T172, T172 and T173, T173 and T174, T174 and T175, T175 and T176, T176 and T177, T177 and T178, and T178 and T179 are alternately changed, by the case of 4 cycles and that of 5 cycles of the operation clock.

When the data shift signal 165 becomes high level 10 times, the counter enable control circuit 58 sets the counter enable signal 59 and the data select signal 166 to the low level, thereby to stop the transmitting operation.

FIG. 18 is a block diagram showing an arrangement of the count value correction circuit 132 in the asynchronous transmitting device shown in FIG. 13. In the figure, reference numeral 260 denotes a one-bit counter, and the level of the output value 63 is inverted each time the data shift signal 165 falls, whereas numeral 210 denotes a selector.

Reference numeral 64 denotes a selector signal input to the selector 210, and the value twice as many as the decimal portion only is input from the number of cycles corresponding to the transmission time for one bit. For example, when the communication time for one bit is set to the time corresponding to 6.5 cycles of the operation clock 163, "1" corresponding to the value twice as many as the decimal portion 0.5 of the numeral 6.5 is input as a selector selection signal 64 to the selector 210. In this way, when the communication time for one bit is set to the time corresponding to 7.0 cycle of the operation clock 163, "0" corresponding to the value twice as many as the decimal portion 0.0 is input as a selector selection signal 64 to the selector 210. Note that this selector selection signal 64 is an output signal from the storage element (not shown) whose value can be set or modified by the CPU or the like (not shown).

When the selector selection signal 64 is "0", the fixed value "0" is selected out of the value 63 fed from the counter 260 (hereinafter referred to as the "counter output value 63") and the fixed value "0", and the thus selected fixed value "0" is output to the control signal generating circuit 131 as a count value correction signal 164. When the selector selection signal 64 is "1", the counter output value 63 is selected out of the counter output value 63 from the counter 260 and the fixed value "0", and the thus selected counter output value 63 is output to the control signal generating circuit 131 as a count value correction signal 164.

As shown above, according to this third embodiment, by adding a count value correction circuit 132 to the control signal generating circuit 131 and the parallel-to-serial conversion circuit 133, the sampling interval of the communication data can be changed per data bit. For this reason, the sampling interval can be set more precisely than a multiple of integer of the operation clock, so that the baud rate can be more precisely set without raising the operation frequency of the asynchronous serial data transmitting device as a transmitter section, and thus setting error of the baud rate between the asynchronous serial data receiving device as a receiver section and the asynchronous serial data transmitting device as a transmitter section can be efficiently reduced, and the maximum baud rate can thereby be improved.

Fourth Embodiment

FIG. 19 is a block diagram showing an arrangement of the count value correction circuit in the asynchronous serial data transmitting device according to the fourth embodiment of the present invention. The count value correction circuit of this fourth embodiment is an improved arrangement of the count value correction circuit 132 shown in FIG. 18. In the figure, reference numeral 290 denotes a 2-bit counter, numeral 320 denotes a selector of 4 inputs and 1 output, wherein when the selector selection signal is 0, 1, 2 and 3, input signals 66, 67, 68 and 69 are respectively selected and output as a count value correction signal 70. Numerals 300 and 310 are logic circuits for inputting the counter value 65 output from the counter 290 so as to carry out logic operation. Numeral 311 denotes an inverter.

The operation of the asynchronous serial data transmitting device according to the fourth embodiment of the present invention is now explained below.

The count value correction circuit 190 shown in FIG. 19 can set the communication time for one bit of the communication data 4 per 0.25-cycle unit such as 4.0 cycles, 4.25 cycles, 4.50 cycles and 4.75 cycles.

Figure 22:
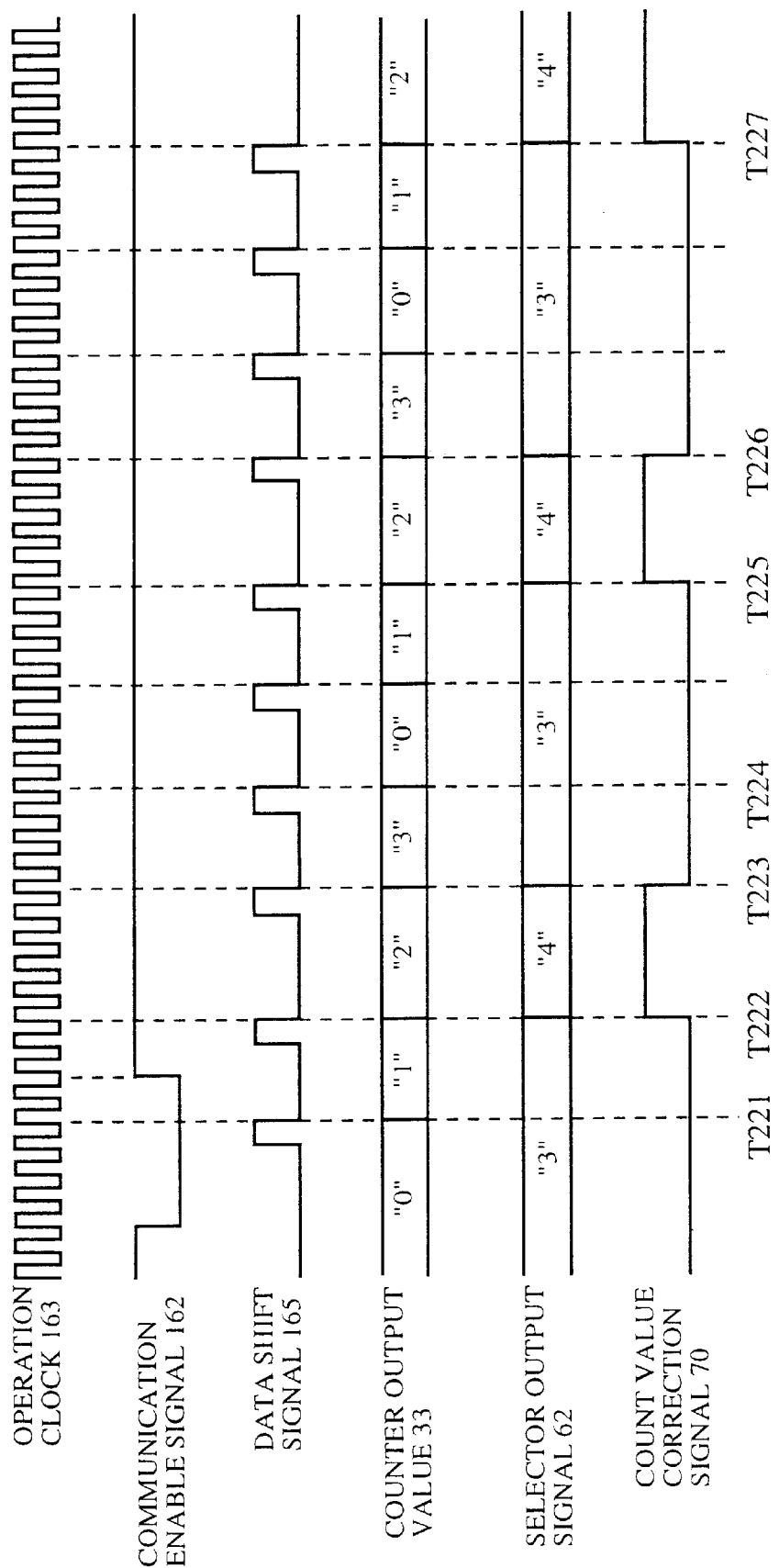
FIG. 22 is a timing chart showing the operation of the count value correction circuit shown in FIG. 19.

FIG. 20 is an exemplary view showing a truth table of the logic circuit 300, and FIG. 21 is an exemplary view showing a truth table of the logic circuit 310. FIG. 22 is a timing chart showing the operation of the count value correction circuit 190 of the present embodiment.

When the communication time for one bit is set to the time corresponding to 4.25 cycle, "1" corresponding to the value four times as many as the decimal portion 0.25 of the numeral 4.25 is input as a selector selection signal 39. Thus, an input signal 67 is selected in the selector 320, and is output as a count value correction signal 70. During the transmitting operation, the counter output value 65 is incremented each time the data shift signal 165 falls. On the basis of the truth table shown in FIG. 20, each time the data for 4 bits is transmitted, the input signal 67, namely the count value correction signal 70 is set to the high level for the time period corresponding to one bit. (time period between T222 and T223, and that between T225 and T226).

When the count value correction signal 70 is in the low level, the communication data 4 is transmitted at 4-cycle intervals, and when the count value correction signal 70 is in the high level, the correction data 4 is transmitted at 5-cycle intervals. Due to this, the communication data 4 of one bit is transmitted at 4.25 cycles on an average.

The fourth embodiment has explained as to the case in which the communication time for one bit of the communication data 4 is set per 0.25-cycle unit in the count value correction circuit 190 as shown in FIGS. 19 and 22, such as 4.00 cycles, 4.25 cycles, 4.50 cycles and 4.75 cycles. However, the present invention is not limited to this, but a count value correction circuit capable of setting the baud rate more precisely such as 0.125-cycle unit or the like can be implemented, according to the same method as that of FIGS. 9 and 12, but in combination with the logic circuits, selector selection signal and the selector.

As explained heretofore, according to the fourth embodiment, since the count value correction circuit 190 is formed by use of the counter 290, the logic circuits 300 and 310, and also the selector 320, the communication time for one bit can be set per 0.25-cycle unit, or by more precise baud rate. Accordingly, the time interval for sampling the communication data can be changed for each bit, thereby to enable to set the sampling interval more precisely than a multiple of integer of the operation clock. Thus, the baud rate can be more precisely set without raising the operation frequency of the asynchronous serial data transmitting device as a transmitter section, and accordingly setting error of the baud rate between the synchronous serial data receiving device as a receiver section and the asynchronous serial data transmitting device as a transmitter section can be efficiently suppressed, and the maximum baud rate can thereby be improved.

As shown above, in the asynchronous serial data receiving device and the asynchronous serial data transmitting device according to the present invention, it is arranged such that a count value correction circuit is added to the control signal generating circuit and the serial-to-parallel conversion circuit, so that in the asynchronous serial data transmission, the sampling interval of the communication data during the asynchronous data receiving operation in the receiving device can be changed as to each bit, whereas the transmission interval of the communication data during the asynchronous data transmitting operation in the transmitting device can also be changed per each bit. For this reason, the baud rate can be more precisely set without raising the operation frequency of the asynchronous serial data receiving device and that of the asynchronous serial data transmitting device respectively as a receiver section and a transmitter section, and thus, setting error of the baud rate between the asynchronous serial data receiving device as a receiver section and the asynchronous serial data transmitting device as a transmitter section can be efficiently suppressed, and the maximum baud rate can be improved.

Further, since the count value correction circuit is formed by use of a counter, logic circuits and also a selector, the time interval for sampling the communication data can be changed per each bit, so that it is enabled to set the sampling interval more precisely than a multiple of integer of the operation clock. Therefore, the baud rate can be more precisely set even without raising the operation frequency of the asynchronous serial data receiving device or of the asynchronous serial data transmitting device, and accordingly setting error of the baud rate between the asynchronous serial data receiving device as a receiver: section and the asynchronous serial data transmitting device as a transmitter section can be efficiently suppressed, and the maximum baud rate can be improved.

What is claimed is:

1. An asynchronous serial data receiving device comprising;

a serial-to-parallel data conversion means, which takes in a communication data of one transmission unit starting with a start bit, and converts and outputs the communication data into a parallel data, a control signal generating means for generating a data shift signal to indicate the timing at which said serial-to-parallel conversion means should take in each of the bit data forming the communication data, and outputting the generated data shift signal to said serial-to-parallel conversion means, a count correction means, which generates a count value correction signal for controlling the time interval between a first timing at which it takes the first bit data of the received communication data into said serial-to-parallel conversion means and the second timing at which it takes in the second bit data following the first bit data into said serial-to-parallel conversion means for each of the bit data of said communication data, and outputs the generated count value correction signal to said control signal generating means, wherein, said control signal generating means controls the output timing of said data shift signal in accordance with the count value correction signal output from said count correction means, and said serial-to-parallel conversion means takes in each of the bit data of said communication data on the basis of said data shift signal.

2. An asynchronous serial data receiving device according to claim 1, wherein said count correction means comprises:

a counting means for sequentially inputting the data shift signals, and counting the number of said data shift signals, and a selecting mean for selecting either one of the signal output from said counting means and a predetermined value, and outputting the selected value to said control signal generating means as a count value correction signal.

3. An asynchronous serial data receiving device according to claim 2, wherein said counting means is formed by a plurality of data bits, and wherein said count correction means further comprises a plurality of logic circuits, each of which receives a signal fed from said counting means and performs a logical operation to decide the logic value of the signal input to said selecting means in accordance with the value of the signal output from said counting means.

4. An asynchronous serial data transmitting device comprising;

a parallel-to-serial data conversion means, which transmits a communication data of one transmission unit starting with a start bit, and converts and outputs the communication data into a serial data, a control signal generating means for generating a data shift signal to indicate the timing at which said parallel-to-serial conversion means should transmit each of the bit data forming said communication data, and outputting the generated data shift signal to said parallel-to-serial conversion means, a count correction means, which generates a count value correction signal for controlling the time interval between a first timing at which it transmits the first bit data of the received communication data from said parallel-to-serial conversion means and the second timing at which it transmits the second bit data following the first bit data from said parallel-to-serial conversion means for each bit data of said communication data, and outputs the generated count value correction signal to said control signal generating means, wherein, said control signal generating means controls the output timing of said data shift signal in accordance with the count value correction signal output from said count correction means, and said parallel-to-serial conversion means transmits each of the bit data of said communication data on the basis of said data shift signal.

5. An asynchronous serial data transmitting device according to claim 4, wherein said count correction means comprises:

a counting means for sequentially inputting the data shift signals, and counting the number of said data shift signals, and a selecting mean for selecting either one of the output from said counting means and a predetermined value, and outputting the selected value to said control signal generating means as a count value correction signal.

6. An asynchronous serial data transmitting device according to claim 5, wherein said counting means is formed by a plurality of data bits, and wherein said count correction means further comprises a plurality of logic circuits, each of which receives a signal fed from said counting means and performs a logical operation to decide the logic value of the signal input to said selecting means in accordance with the value of the signal output from said counting means.

* * * * *